(12) United States Patent
Kuriyama et al.

(10) Patent No.: US 9,778,401 B2
(45) Date of Patent: Oct. 3, 2017

(54) OPTICAL ELEMENT AND IMAGING APPARATUS

(71) Applicant: SONY CORPORATION, Tokyo (JP)

(72) Inventors: Akito Kuriyama, Kanagawa (JP); Isamu Konishiike, Kanagawa (JP); Kazumasa Yagi, Aichi (JP); Keisuke Ootsu, Aichi (JP); Tatsuya Nakatsuji, Kanagawa (JP); Takumi Tsuji, Chiba (JP); Hitoshi Nakanishi, Kanagawa (JP); Masaki Ando, Chiba (JP)

(73) Assignee: SONY CORPORATION, Tokyo (JP)

( * ) Notice: Subject to any disclaimer, the term of this patent is extended or adjusted under 35 U.S.C. 154(b) by 263 days.

(21) Appl. No.: 14/659,811

(22) Filed: Mar. 17, 2015

(65) Prior Publication Data

US 2015/0277001 A1     Oct. 1, 2015

(30) Foreign Application Priority Data

Mar. 26, 2014   (JP) .................................. 2014-063703

(51) Int. Cl.
*G02B 3/00*     (2006.01)
*G02B 5/20*     (2006.01)
*H01L 27/146*   (2006.01)

(52) U.S. Cl.
CPC ........ *G02B 5/208* (2013.01); *H01L 27/14625* (2013.01)

(58) Field of Classification Search
CPC . G02B 3/00; G02B 5/20; G02B 13/00; G02B 2003/0093
USPC .................................. 250/216; 359/642, 648
See application file for complete search history.

(56) References Cited

U.S. PATENT DOCUMENTS

2014/0340568 A1* 11/2014 Sano .................. G02B 13/0045
                                                      348/360

FOREIGN PATENT DOCUMENTS

JP     H11-038206 A    2/1999

* cited by examiner

*Primary Examiner* — Kevin Pyo
(74) *Attorney, Agent, or Firm* — Chip Law Group

(57) ABSTRACT

An optical element in which light with a large principal ray input angle is gradually input from a center to a peripheral portion, a thickness gradually increases from the center to the peripheral portion, and $1<RD\leq1.085$ is satisfied, when an increase ratio of a thickness to the center at an outermost peripheral portion to which light of which the principal ray input angle is maximum is input is set to RD.

9 Claims, 5 Drawing Sheets

OPTICAL ELEMENT AND IMAGING APPARATUS

CROSS REFERENCE TO RELATED APPLICATIONS

This application claims the benefit of Japanese Priority Patent Application JP 2014-063703 filed Mar. 26, 2014, the entire contents of which are incorporated herein by reference.

BACKGROUND

The present technology relates to an optical element in which light with a large principal ray input angle is gradually input from a center to a peripheral portion, and an imaging apparatus which includes the optical element. Japanese Unexamined Patent Application Publication No. 11-38206 is an example of the related art.

For example, there is an imaging apparatus such as a still camera or a video camera in which an optical element is arranged as an optical filter in the vicinity of an imaging element on the object side. As an example of such an imaging element, there is a UV/IR cutoff filter, or the like, which cuts off ultraviolet light or infrared light.

SUMMARY

Here, as a general optical element, an optical element in which optical characteristics such as spectral transmittance characteristics or reflectance characteristics change depending on a ray input angle is used (so-called angle dependence).

Meanwhile, in recent years, due to miniaturization (thinning) of an imaging optical system, an input distance of a ray to an optical element became short, and along with this, an input angle of a ray with respect to the peripheral portion of the optical element became large. In an optical element which is arranged in the vicinity of the imaging element, since an input angle of a ray is set approximately to 0 degrees at a center portion, that is, a portion in the vicinity of an optical axis, and an input angle of a ray becomes large at a portion which is far from the center portion, when an input angle of a ray at the peripheral portion becomes large as described above, this means that unevenness in input angle of a ray becomes large from a center to the peripheral portion in the optical element.

In addition, in this manner, when the unevenness in input angle of ray becomes large from a center to the peripheral portion, unevenness in optical characteristics also becomes large.

When unevenness in optical characteristics becomes large, deterioration in optical performance becomes remarkable, and there is a problem of deterioration in image quality. Specifically, in a case of the above described UV/IR cutoff filter, an occurrence of color shading becomes remarkable, and there is a problem of deterioration in image quality in terms of color reproducibility.

It is desirable to provide an optical element of which unevenness in optical characteristics due to a difference in input angle of a ray is suppressed, and a deterioration in optical performance is suppressed, in an optical element in which light with a large principal ray input angle is gradually input from a center to a peripheral portion.

According to an embodiment of the present technology, there is provided an optical element in which light with a large principal ray input angle is gradually input from a center to a peripheral portion, a thickness gradually increases from the center to the peripheral portion, and $1 < RD \leq 1.085$ is satisfied, when an increase ratio of a thickness to the center at an outermost peripheral portion to which light of which the principal ray input angle is a maximum is input is set to RD.

In this manner, unevenness in optical characteristics due to a difference in input angle of a ray is suppressed corresponding to a case in which the principal ray input angle at the outermost peripheral portion is set to approximately 45° or less.

In the optical element according to a second embodiment of the present technology, it is preferable to satisfy $1 < RD \leq 1.045$.

In this manner, unevenness in optical characteristics due to a difference in input angle of a ray is suppressed corresponding to a case in which the principal ray input angle at the outermost peripheral portion is set to approximately 30° or less.

It is preferable that the optical element according to a third embodiment of the present technology includes a dielectric multilayer film, and a thickness of the dielectric multilayer film becomes gradually large from a center to a peripheral portion.

The dielectric multilayer film is preferable when realizing various optical filters, and unevenness in optical characteristics due to a difference in input angle of a ray is suppressed when the thickness of the dielectric multilayer film becomes gradually large from the center to the peripheral portion.

In the optical element according to a fourth embodiment of the present technology, it is preferable that the dielectric multilayer film is formed by alternately laminating a high refractive index material and a low refractive index material.

The dielectric multilayer film which is formed by alternately laminating a high refractive index material layer and a low refractive index material layer is particularly preferable when realizing various optical filters.

In the optical element according to a fifth embodiment of the present technology, it is preferable that the dielectric multilayer film is formed by alternately laminating a $TiO_2$ layer and a $SiO_2$ layer. It is preferable to use $TiO_2$ and $SiO_2$ as a dielectric, when distributing the film thickness.

In the optical element according to a sixth embodiment of the present technology, it is preferable to set the total number of layers of the dielectric multilayer film to be 70 or less.

The reason for this is that when the number of total layers of the dielectric multilayer film exceeds 70, it is difficult to execute desirable thickness distribution from a center to a peripheral portion, and this leads to reduction in productivity due to an increase in tact.

In the optical element according to a seventh embodiment of the present technology, it is preferable to set the number of total layers to 40 to 60. In this manner, it is possible to more easily control the thickness distribution from a center to a peripheral portion.

In the optical element according to an eighth embodiment of the present technology, it is preferable to set a transmittance with respect to a wavelength range of 450 nm to 650 nm at a center portion to be larger than 90%. In this manner, most of visible light is transmitted.

According to another embodiment of the present technology, there is provided an imaging apparatus which includes an imaging element, and the optical element according to the embodiments of the present technology.

In this manner, unevenness in optical characteristics due to a difference in input angle of a ray is suppressed due to corresponding to a case in which a principal ray input angle at the outermost peripheral portion of the optical element is set to approximately 45° or less.

According to still another embodiment of the present technology, there is provided an optical element in which light with a large principal ray input angle is gradually input from a center to a peripheral portion, a thickness gradually increases from the center to the peripheral portion, and a thickness increase rate y with respect to a principal ray input angle x is in a range of a thickness increase rate y which is expressed using $y=0.0018x^2+0.0092x$ or more, and a thickness increase rate y which is expressed using $y=0.0059x^2+0.0298x$ or less, when the principal ray input angle is set to x, and an increase ratio of a thickness at a position to which light with the principal ray input angle x is input to the center is set to y.

In addition, the imaging apparatus according to still another embodiment of the present technology includes an imaging element, and an optical element which satisfies range conditions of the above described thickness increase rate y.

It is also possible to suppress unevenness in optical characteristics due to a difference in input angle of a ray, using the optical element, and the imaging apparatus according to still another embodiment of the present technology.

According to the embodiment of the present technology, it is possible to suppress deterioration in optical performance due to a difference in input angle of a ray due to corresponding to a case in which a principal ray input angle at the outermost peripheral portion is set to approximately 45° or less with respect to an optical element to which light with a large principal ray input angle gradually inputs from a center to the peripheral portion.

In addition, the effect which is described here is not necessarily limited, and it may be any one of effects which are described in the present disclosure.

DETAILED DESCRIPTION OF EMBODIMENTS

Figure 1:
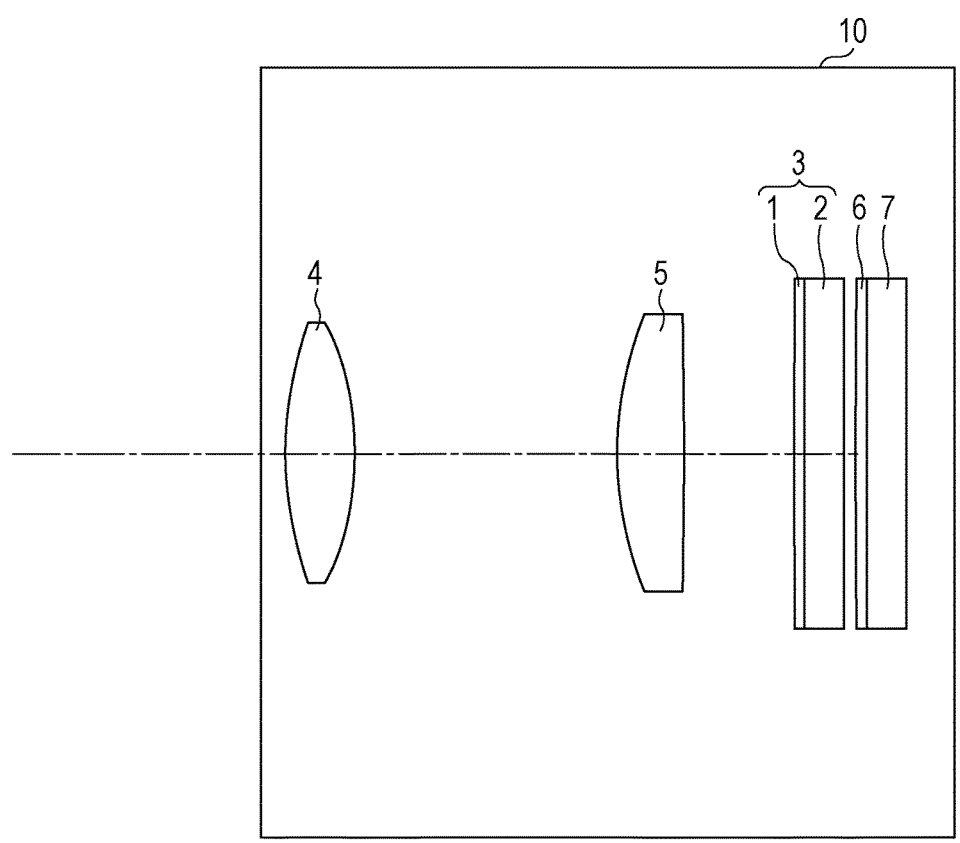
FIG. 1 is a schematic diagram of an imaging apparatus as an embodiment.

Hereinafter, embodiments will be described in the following order:
1. Configuration of imaging apparatus
2. Regarding problem associated with angle dependence
3. Optical element according to embodiment
4. Conclusion for embodiment
5. Modification example
6. Present technology 1. Configuration of Imaging Apparatus Hereinafter, an optical element 1 and an imaging apparatus 10 as embodiments of the present technology will be described with reference to accompanying drawings.

FIG. 1 is a cross-sectional view of the imaging apparatus 10. The imaging apparatus 10 includes a first lens 4, a second lens 5, a pre-sensor element 3 including the optical element 1, seal glass 6, and an imaging element 7, and these optical elements are arranged in this order from an object side in a housing (not illustrated).

The first lens 4 condenses light from an object, and the second lens 5 forms the light which is condensed using the first lens 4 on an imaging face of the imaging element 7 as an image.

The imaging element 7 is formed of a charge coupled device (CCD) image sensor, a complementary metal oxide semiconductor (CMOS) image sensor, or the like, and the seal glass 6 is protective glass which covers the imaging face of the imaging element 7.

The element before sensor 3 which is arranged between the second lens 5 and the seal glass 6 is set to an optical filter which selectively transmits light with a predetermined property in input light beams, and does not transmit light other than that. The element before sensor 3 in the embodiment is set to an optical filter which selectively transmits light with a predetermined wavelength range which is included in input light, and more specifically, the element before sensor is set to a UV/IR cutoff filter which cuts off ultraviolet light and infrared light (that is, selectively transmits visible light).

The element before sensor 3 includes infrared absorbing glass 2 which is formed in a plate shape, and the optical element 1 which is formed on a face of the infrared absorbing glass 2 on the object side. The infrared absorbing glass 2 absorbs infrared light similarly to so-called heat absorbing glass.

The optical element 1 is configured of a dielectric multilayer film, and functions as a UV/IR cutoff film. In a case of the embodiment, the dielectric multilayer film which configures the optical element 1 is formed by alternately laminating a high refractive index material layer and a low refractive index material layer. Specifically, the dielectric multilayer film is formed by alternately laminating the high refractive index material layer and the low refractive index material layer on a face of the infrared absorbing glass 2 on the object side, by setting the infrared absorbing glass 2 as a substrate. Here, a high refractive index material is a material which shows high refractivity with respect to a base material, and a low refractive index material is a material which shows low refractivity with respect to the base material.

In a case of the embodiment, a $TiO_2$ layer is used as the high refractive index material layer, and a $SiO_2$ layer is used as the low refractive index material layer. In addition, there is a material of tantalum(Ta)-based, niobium(Nb)-based, or the like, in addition to titanium (Ti) as the high refractive index material, and there is magnesium fluoride ($MgF_2$), silicon oxide ($SiO_x$), or the like, as the low refractive index material, and it is not necessarily limited to $TiO_2$, and $SiO_2$.

The total number of layers of the optical element 1 using a lamination of the high refractive index material layer and the low refractive index material layer is set to 40 to 60 in consideration of a thickness distribution which will be described later.

The element before sensor 3 is arranged so that a center of the optical element 1 matches an optical axis of an optical imaging system (dot-dash line in figure). An air space of approximately 1 mm to 2 mm is interposed between the element before sensor 3 and the seal glass 6.

In the element before sensor 3, the transmittance with respect to a wavelength range of 450 nm to 650 nm at a center portion of the optical element 1 is set to be larger than 90%.

In addition, in FIG. 1, only the UV/IR cutoff filter as the element before sensor 3 which is arranged between the second lens 5 and the imaging element 7 is exemplified; however, as a matter of course, it is possible to arrange another optical filter such as a low pass filter along with the UV/IR cutoff filter, for example.

In addition, there also is a case in which another optical element such as a mechanical shutter is provided between the second lens 5 and the imaging element 7.

In addition, a reading circuit of a photoelectric conversion signal which is obtained from the imaging element 7, a circuit unit which performs various processes with respect to a signal which is read using the reading circuit (capturing image signal), or the like, is provided in the imaging apparatus 10; however, the circuits are not illustrated.

2. Regarding Problem Associated with Angle Dependence

Figure 2:
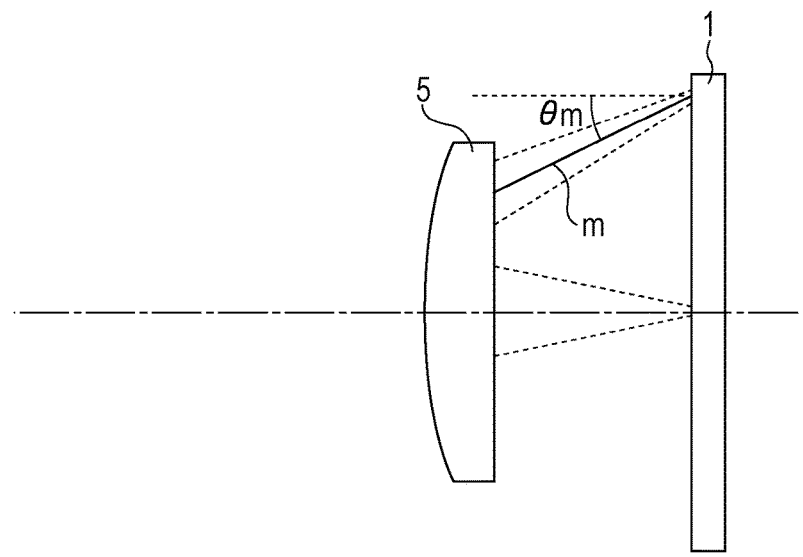
FIG. 2 is an explanatory diagram related to input light which is input to an optical element as the embodiment.

FIG. 2 is an explanatory diagram related to input light which is input to the optical element 1. Light which is emitted from each position of an object is input through the second lens 5 with respect to the optical element 1. A principal ray m (not illustrated) of input light which is input to a center of the optical element 1 in the input light beams matches an optical axis (dot-dash line in figure), and accordingly, a principal ray input angle θm of the input light which is input to the center is 0 degrees. Meanwhile, in input light which is input to the peripheral portion of the optical element 1, the principal ray m is input at the principal ray input angle of θm≠0, not in parallel to the optical axis as illustrated.

At this time, the principal ray input angle θm of each light which is input to the optical element 1 from the second lens 5 becomes small when being closer to the optical axis. That is, when viewed from the optical element 1, the principal ray input angle θm becomes small when it is light of which an input position is close to a center.

As can be understood from this point, light of which the principal ray input angle θm is large is gradually input from a center to the peripheral portion in the optical element 1 which is arranged between the second lens 5 and the imaging element 7.

Here, as described above, due to miniaturization (thinning) of an imaging optical system in recent years, an input distance of a ray which is input to the optical element 1 which is arranged in the vicinity of the imaging element 7 on the object side becomes short, and along with this point, an input angle of a ray which is input to the peripheral portion of the optical element 1 becomes large. For this reason, unevenness of optical characteristics of the optical element 1 becomes large, deterioration in optical performance becomes remarkable, and there is a problem of deterioration in image quality, due to angle dependence of the optical element 1. That is, an occurrence of color shading becomes remarkable, and there is a problem of deterioration in image quality in terms of color reproducibility in the optical element 1 as the UV/IR cutoff film (UV/IR cutoff filter).

Figure 3:
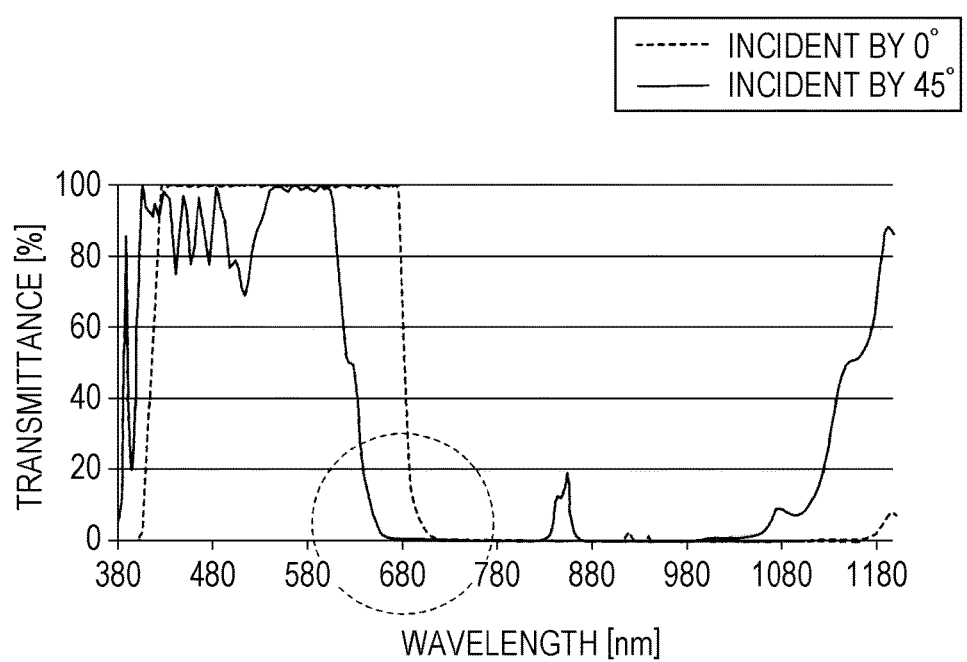
FIG. 3 is a diagram for describing a relationship between an input angle of a ray and wavelength and transmittance characteristics related to the optical element in the embodiment.

FIG. 3 is a diagram for describing a relationship between an input angle of a ray and wavelength and transmittance characteristics related to the optical element 1, and the dotted line in the figure denotes an input light with the principal ray input angle θm=0 degrees, and the solid line denotes wavelength and transmittance characteristics in input light with the principal ray input angle θm=45 degrees, respectively.

As is surrounded with the dotted line in the figure, a red component which is transmitted in the input light with the principal ray input angle θm=0 degrees is cut off in the input light with the principal ray input angle θm=45 degrees. For this reason, the input light with the principal ray input angle θm=45 degrees becomes yellowish light after passing through the optical element 1.

Since light with a large principal ray input angle θm is gradually input from a center to the peripheral portion in the optical element 1, as described above, an occurrence of color shading in which a yellowish color becomes gradually strong from a center to the peripheral portion is caused by this.

With respect to deterioration in image quality which occurs due to the angle dependence of the optical element 1 like this, it is possible to perform a correction of an captured image using image processing. For example, it is possible to perform a correction using a shading correction process corresponding to the color shading which occurs due to the optical element 1 as the UV/IR cutoff film.

However, there is a concern that separate deterioration in image quality may occur when a correction using such image processing is performed. Specifically, there is a concern that deterioration in image quality other than the color shading may occur.

In addition, in order to suppress unevenness of optical characteristics, it is effective to make an input distance of light with respect to the optical element 1 long in order to suppress a principal ray input angle θm at the peripheral portion of the optical element 1; however, this goes against a trend of miniaturizing the imaging optical system in recent years, and is not preferable.

3. Optical Element in Embodiment

Figure 4:
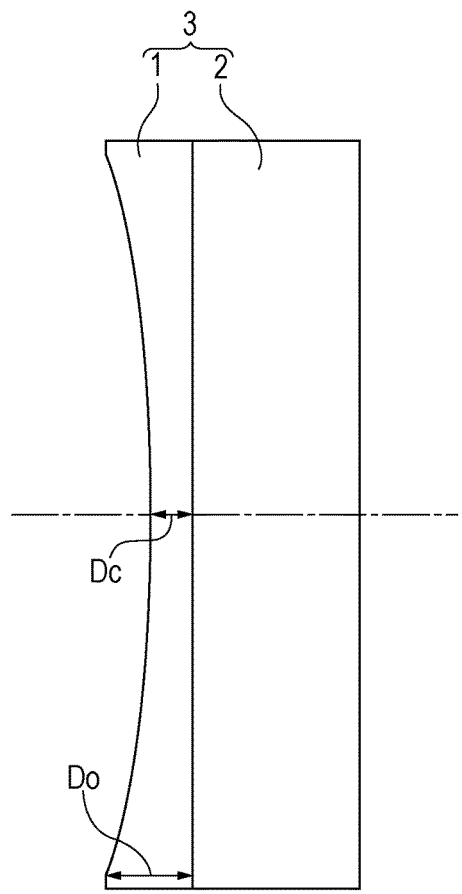
FIG. 4 is a schematic cross-sectional view of a pre-sensor element which includes the optical element in the embodiment.

Therefore, according to the embodiment, the thickness of the optical element 1 is gradually increased from a center to the peripheral portion as illustrated in the schematic cross-sectional view in FIG. 4.

At this time, a control of the thickness is performed by controlling the thickness of each layer which configures the optical element 1 in the embodiment in which the multilayer film structure is adopted. That is, a thickness distribution of each layer (thickness distribution from center to peripheral portion) is controlled so that the thickness distribution from the center to the peripheral portion of the optical element 1, which will be described later, is executed.

When taking control of the thickness distribution into consideration, it is preferable to set the total number of layers of the dielectric multilayer film which configures the optical element 1 to be 70 or less. When the total number of layers of the dielectric multilayer film exceeds 70, it is difficult to execute desirable thickness distribution, and this leads to reduction in productivity due to an increase in tact.

Accordingly, by suppressing the total number of layers to 70 or less, it is possible to easily manufacture the optical element 1 according to the embodiment, and to improve productivity.

In addition, the reason why it is difficult to execute desirable thickness distribution when the number of layers increases is that unevenness in thickness of each layer increases when the number of layers increases, and it is difficult to manage the general thickness distribution when manufacturing the dielectric multilayer film.

In addition, it is preferable to set the total number of layers to 40 to 60 more preferably. It is easier to control the thickness distribution of the optical element 1 by suppressing the total number of layers to 40 to 60.

Accordingly, it is possible to manufacture the optical element 1 according to the embodiment more easily, and to further improve productivity by further restricting the total number of layers.

According to the embodiment, as specific thickness distribution conditions, conditions using the following expression (1) are satisfied under the premise that the thickness of the optical element 1 is gradually increased from a center to the peripheral portion, as described above.

That is, in the optical element 1, when a portion to which light with the maximum principal ray input angle θm is input is set to "outermost peripheral portion", the thickness at the outermost peripheral portion is set to "Do", and the thickness at the center is set to "Dc" as illustrated in FIG. 4, the increase ratio RD of the thickness Do to the thickness Dc satisfies $$1 < RD \leq 1.085 \quad \text{(Expression 1)}$$

In addition, when "RD" is set to an increase rate (%), not an increase ratio of the thickness, the "Expression 1" can be denoted by "0<RD≤8.50".

In addition, the "outermost peripheral portion" of the optical element 1 means a portion to which light with the maximum principal ray input angle θm is input in a range of contributing to an image generation of the imaging element 7. When the optical element 1 is formed in a rectangular shape corresponding to the imaging element 7 without being formed in a circular shape about the optical axis, the "outermost peripheral portion" means four corner portions of the optical element 1, not the entire rectangular outermost periphery.

Hereinafter, a meaning of the "Expression 1" will be described.

Figure 5:
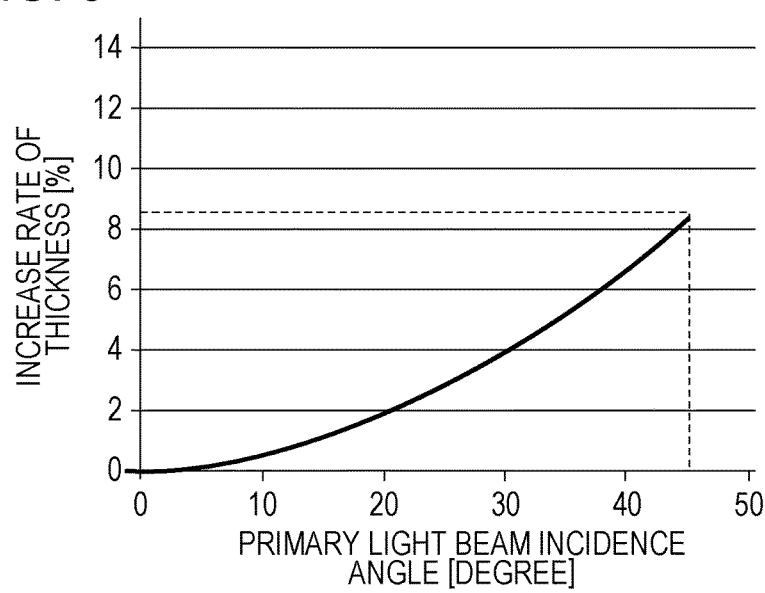
FIG. 5 is a diagram which illustrates a result of a calculation of an optimal thickness increase rate at each input angle of a ray.

FIG. 5 illustrates a result of a calculation with respect to an optimal thickness increase rate (%) in each principal ray input angle θm.

In addition, in FIG. 5, the "thickness increase rate" which is denoted on the vertical axis is a thickness increase rate with respect to the thickness Dc at the center. That is, the thickness increase rate is an increase rate of the thickness at a position to which light with the principal ray input angle θm denoted on the horizontal axis is input with respect to the thickness Dc (that is, increase rate with respect to thickness at position in which principal ray input angle θm=0). The "optimal thickness increase rate" referred to here means a thickness increase rate which can obtain the same optical characteristics as those when the principal ray input angle θm=0 degrees (in the embodiment, wavelength and transmittance characteristics).

When expressing the calculation result in FIG. 5, if the principal ray input angle θm is set to x, and the optimal thickness increase rate is set to y, this is expressed as $$y = 0.0038x^2 + 0.0195x \quad \text{(Expression 2)}$$

Here, in FIG. 5, the calculation result is illustrated up to the principal ray input angle θm of 45 degrees; however, when considering a limitation in design of the imaging optical system, this is premised on the fact that the maximum principal ray input angle θm of input light with respect to the optical element 1 does not exceed a maximum of 45 degrees.

Hereinafter, an optimal thickness increase rate which is derived from Expression 2 in a range of the principal ray input angle θm=0 degrees to 45 degrees will be denoted in units of θm=5 degrees.

| | |
|---|---|
| 0 degrees | 0.00% |
| 5 degrees | 0.02% |
| 10 degrees | 0.30% |
| 15 degrees | 0.90% |
| 20 degrees | 1.50% |
| 25 degrees | 3.00% |
| 30 degrees | 4.40% |
| 35 degrees | 5.80% |
| 40 degrees | 7.00% |
| 45 degrees | 8.50% |

As can be understood from the above-described calculation results, according to the optical element 1 in the embodiment in which the thickness gradually increases from a center to the peripheral portion, and the previous Expression 1 with respect to the increase ratio RD is satisfied, it is possible to suppress unevenness in optical characteristics due to a difference in input angle of a ray, due to corresponding to a case in which the principal ray input angle θm at the outermost peripheral portion (that is, maximum principal ray input angle θm) is set to approximately 45 degrees or less.

That is, even when the principal ray input angle θm with respect to the outermost peripheral portion of the optical element 1 becomes the maximum principal ray input angle θm which is obtained based on a limitation in design of the imaging optical system, it is possible to suppress unevenness in optical characteristics due to a difference in input angle of a ray.

Here, as described above, light with a large principal ray input angle θm is input to the optical element 1 from a center to the outermost peripheral portion; however, according to the embodiment, thickness distribution from the center to the outermost peripheral portion of the optical element 1 is formed so that the relationship between the principal ray input angle θm and the thickness increase rate using the Expression 2 is satisfied according to a principal ray input angle θm of an input ray at each position from the center to the outermost peripheral portion.

In this manner, it is possible to suppress a difference in optical characteristics due to a difference in input angle of a ray with respect to all of rays which are input to the optical element 1.

Figure 6:
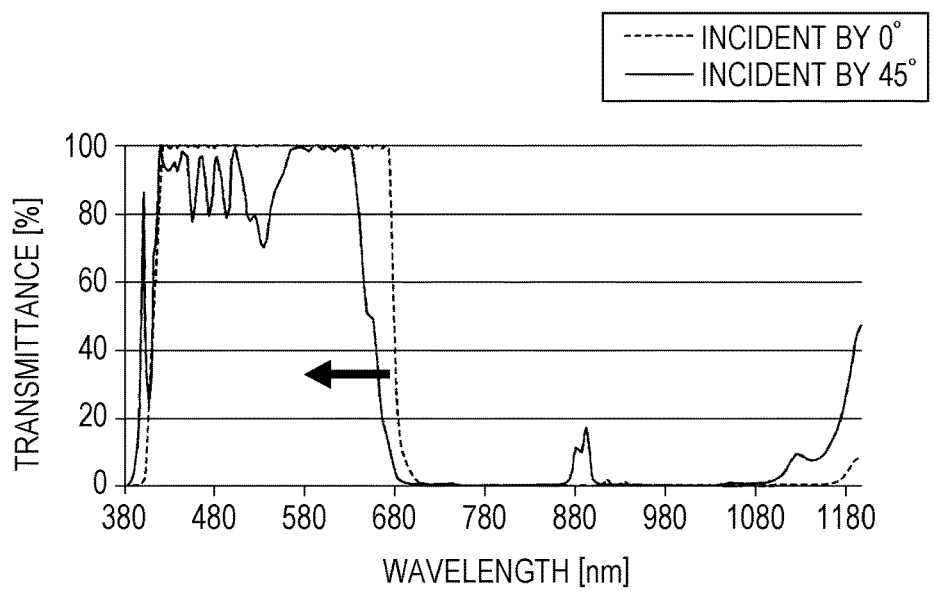
FIG. 6 is a diagram which illustrates wavelength and transmittance characteristics in a case in which a thickness increase rate with respect to an input angle of a ray of 45° is set to be larger than 8.50%.
Figure 7:
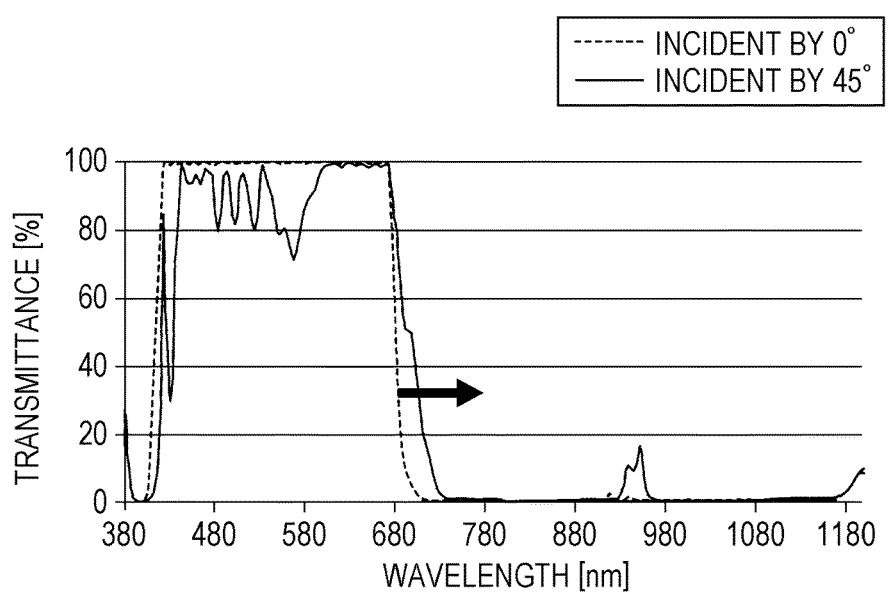
FIG. 7 is a diagram which illustrates wavelength and transmittance characteristics in a case in which the thickness increase rate with respect to the input angle of the ray of 45° is set to be less than 8.50%.
Figure 8:
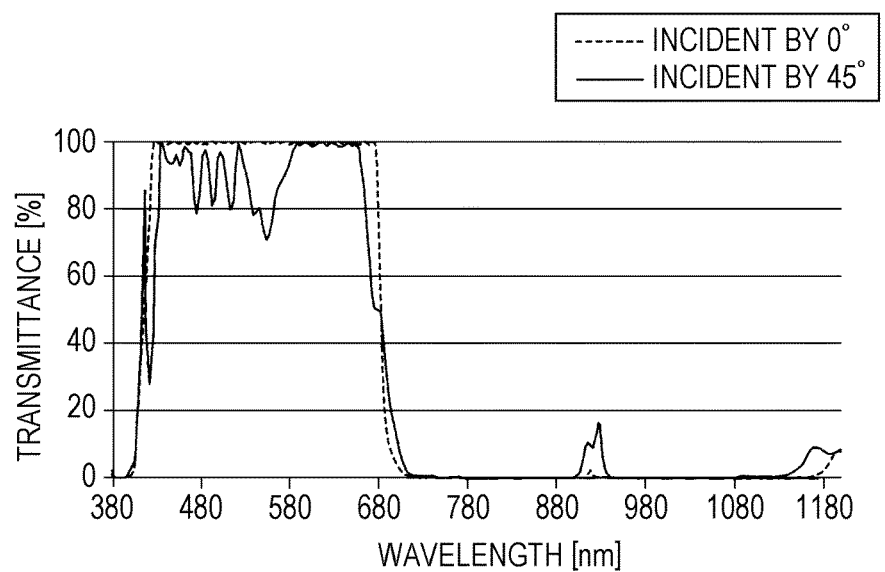
FIG. 8 is a diagram which illustrates wavelength and transmittance characteristics in a case in which the thickness increase rate with respect to the input angle of the ray of 45° is set to 8.50%.

FIGS. 6 and 7 illustrate wavelength and transmittance characteristics in a case in which a thickness increase rate is set to be larger than 8.50%, and a case in which the thickness increase rate is set to be smaller than 8.50%, when an input angle of ray θm=45 degrees, respectively, and FIG. 8 illustrates wavelength and transmittance characteristics when the thickness increase rate with respect to the input angle of ray θm=45 degrees is set to 8.50%.

In addition, in FIGS. 6 to 8, as a comparison, the same characteristics (hereinafter, denoted by "normal characteristics") when a thickness increase rate is set to 0% with respect to a principal ray input angle θm of 0 degrees is denoted using dotted lines.

As illustrated in FIG. 6, when the thickness increase rate is set to be larger than 8.50% with respect to the input angle of ray θm=45 degrees, a cutoff wavelength with respect to the normal characteristics (cutoff on short wavelength side: and so forth) shifts to the short wavelength side. On the other hand, when the thickness increase rate is set to be smaller than 8.50% with respect to the input angle of ray θm=45 degrees as illustrated in FIG. 7, a cutoff wavelength with respect to the normal characteristics shifts to the long wavelength side. In contrast to this, in a case of FIG. 8 in which the thickness increase rate is set to 8.50% with respect to the input angle of ray θm=45 degrees, the wavelength and transmittance characteristics approximately match the normal characteristics.

In addition, though it is not illustrated, when the thickness increase rate according to the expression 2 is also set with respect to each principal ray input angle θm in a range of 0°<θm<45°, the wavelength and transmittance characteristics approximately match the normal characteristics.

It can also be understood from the results in FIGS. 6 to 8 that it is possible to suppress unevenness in optical characteristics due to a difference in input angle of a ray due to corresponding to a case in which a principal ray input angle θm at the outermost peripheral portion is set to approximately 45 degrees or less, using the optical element 1 according to the embodiment in which the thickness gradually increases from a center to the peripheral portion, and which satisfies the previous Expression 1 with respect to the increase ratio RD.

Here, it is more preferable for the increase ratio RD of the thickness to satisfy expression 3.

$$1 < RD \leq 1.045 \quad \text{(Expression 3)}$$

In this manner, it is possible to suppress unevenness in optical characteristics due to a difference in input angle of a ray under a condition that the principal ray input angle θm at the outermost peripheral portion is approximately 30 degrees or less.

When the principal ray input angle θm with respect to the optical element 1 (approximately the same as principal ray input angle with respect to imaging element 7) exceeds appropriately 30 degrees, the following malfunctions become apparent.

Since there is change in light receiving-spectral characteristics depending on an input angle of a ray, a difference in color tone due to the input angle of a ray occurs.

Colors are mixed in a color filter, and ghosting occurs.

Adverse effects occur in a distance measuring performance in a case in which phase difference auto focus (AF) is executed in pixels on the imaging element 7.

Accordingly, it is more preferable for the increase ratio RD to satisfy expression 3.

Meanwhile, expression 2 which has previously been described in FIG. 5 is obtained under a condition of obtaining the same optical characteristics as those when the principal ray input angle θm is 0 degrees with respect to each principal ray input angle θm (that is, with respect to each position from a center to peripheral portion); however, from a viewpoint in which unevenness in optical characteristics due to a difference in input angle of a ray is suppressed, it is not necessary to obtain completely the same optical characteristics as those when the principal ray input angle θm is 0 degrees with respect to each principal ray input angle θm, and a difference of a certain degree is allowable.

Figure 9:
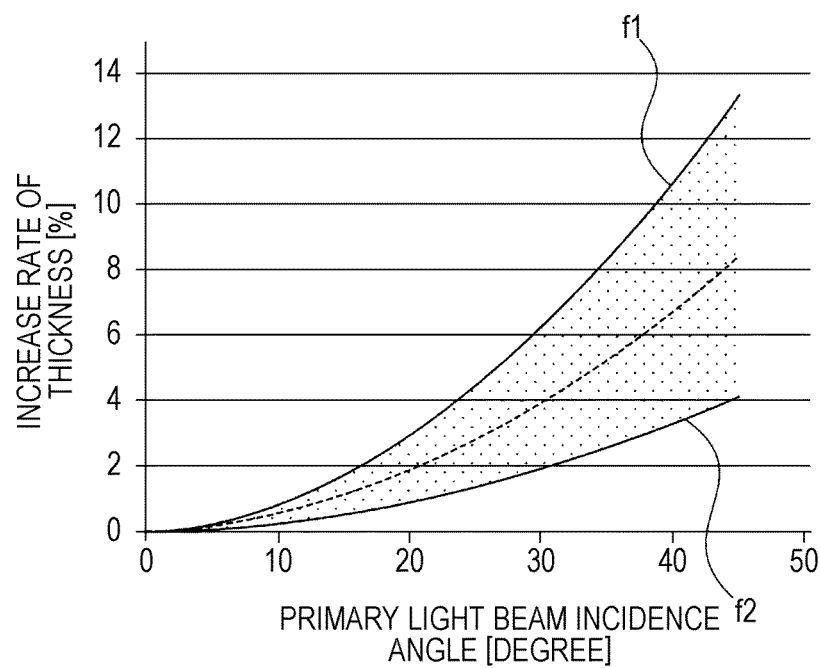
FIG. 9 is a diagram which illustrates an expression of an upper limit allowable value ("f1" in figure), and a lower limit allowable value ("f2" in figure) of the thickness increase rate with respect to an input angle of a ray.

FIG. 9 illustrates the expression of the upper limit allowable value of the thickness increase rate with respect to a principal ray input angle θm ("f1" in figure), and the expression of the lower limit allowable value ("f2" in figure), respectively, by setting the horizontal axis to the principal ray input angle, and the vertical axis to the thickness increase rate, similarly to FIG. 5. In addition, in FIG. 9, the "expression 2" denoted in FIG. 5 is expressed using a dashed line.

The expression of the upper limit allowable value f1, and the expression of the lower limit allowable value f2 are respectively expressed as the following expressions 4 and 5 when a principal ray input angle θm is set to x, and the thickness increase rate is set to y.

$$y = 0.0059x^2 + 0.0298x \quad \text{(Expression 4)}$$

$$y = 0.0018x^2 + 0.0092x \quad \text{(Expression 5)}$$

The respective upper limit value of the thickness increase rate which is expressed in the expression of the upper limit allowable value f1 and the lower limit value of the thickness increase rate which is expressed in the expression of the lower limit allowable value f2 are obtained based on an evaluation standard on whether or not it is possible to allow deterioration in image quality (color shading in the embodiment) in an image which is captured using the optical element 1.

It is also possible to configure the optical element 1 so that the thickness increase rate y at a position to which light with the principal ray input angle x is input is the thickness increase rate y which is calculated using the "expression 5" or more, and is in a range of the thickness increase rate y which is calculated using the "expression 4" or less (range denoted by shaded pattern in FIG. 9).

In this manner, it is possible to suppress unevenness in optical characteristics due to a difference in input angle of a ray so as to fall in a range in which deterioration in image quality is allowed.

4. Conclusion for Embodiment

As described above, in the optical element 1 according to the embodiment, light with a large principal ray input angle θm is gradually input from a center to the peripheral portion, the thickness gradually increases from the center to the peripheral portion, and 1<RD≤1.085 is satisfied hen the increase ratio of thickness to the center at the outermost peripheral portion to which light with the maximum principal ray input angle θm is input is set to RD.

In this manner, it is possible to suppress unevenness in optical characteristics due to a difference in input angle of a ray due to corresponding to a case in which a principal ray input angle θm at the outermost peripheral portion is set to approximately 45 degrees or less.

That is, it is possible to suppress deterioration in an optical performance due to the difference in input angle of a ray, due to corresponding to the case in which the principal ray input angle θm at the outermost peripheral portion is set to approximately 45 degrees or less.

In addition, according to the optical element 1 in the embodiment, since it is possible to omit image processing for correcting deterioration in image quality which is caused by deterioration in the optical performance due to a difference in input angle of a ray, it is possible to prevent an occurrence of separate deterioration in image quality which is associated with the image process.

In addition, since it is not necessary to extend an input distance of a ray with respect to the optical element 1, in order to prevent deterioration in optical performance due to a difference in input angle of a ray, it is possible to contribute to miniaturization of the imaging optical system.

In addition, the optical element 1 according to the embodiment satisfies 1<RD≤1.045.

In this manner, it is possible to suppress unevenness in optical characteristics due to a difference in input angle of a ray, and to suppress deterioration in optical performance due to the unevenness due to corresponding to a case in which a principal ray input angle at the outermost peripheral portion is set to approximately 30 degrees or less.

In addition, the optical element 1 according to the embodiment includes a dielectric multilayer film, and the thickness of the dielectric multilayer film becomes gradually large from a center to the peripheral portion.

The dielectric multilayer film is preferable when manufacturing various optical filters, and it is possible to suppress unevenness in optical characteristics due to a difference in input angle of a ray, since the thickness of the dielectric multilayer film becomes gradually large from a center to the peripheral portion.

Accordingly, it is possible to easily realize the optical element 1 in which the unevenness in optical characteristics due to a difference in input angle of a ray is suppressed.

In addition, in the optical element 1 according to the embodiment, the dielectric multilayer film is formed by alternately laminating a high refractive index material layer and a low refractive index material layer. The dielectric multilayer film in which the high refractive index material layer and the low refractive index material layer are alternately laminated is particularly preferable when manufacturing various optical filters.

Accordingly, it is possible to more easily realize the optical element 1 in which unevenness in optical characteristics due to a difference in input angle of a ray is suppressed.

In addition, in the optical element 1 according to the embodiment, the dielectric multilayer film is formed by alternately laminating a $TiO_2$ layer and a $SiO_2$ layer. It is preferable to use $TiO_2$ and $SiO_2$ as a dielectric when performing thickness distribution.

Accordingly, it is possible to easily manufacture the optical element 1 in which unevenness in optical characteristics due to a difference in input angle of a ray is suppressed.

In addition, in the optical element 1 according to the embodiment, the total number of layers of the dielectric multilayer film is set to 70 or less.

As described above, when the total number of layers of the dielectric multilayer film exceeds 70, it is difficult to execute desirable thickness distribution from a center to the peripheral portion, and this leads to reduction in productivity due to an increase in tact.

Accordingly, by restricting the total number of layers to 70 or less, it is possible to easily manufacture the optical element 1 in which unevenness in optical characteristics due to a difference in input angle of a ray is suppressed, and to improve productivity.

In addition, in the optical element 1 according to the embodiment, the total number of layers may be set to 40 to 60. In this manner, it is easier to control the thickness distribution from a center to the peripheral portion.

Accordingly, it is possible to more easily manufacture the optical element 1 in which unevenness in optical characteristics due to a difference in input angle of a ray is suppressed, and to further improve productivity by further suppressing the total number of layers.

In addition, in the optical element 1 according to the embodiment, a transmittance with respect to wavelength ranges of 450 nm to 650 nm at the center portion is set to be larger than 90%. In this manner, most of visible light is transmitted.

Accordingly, it is preferable for the optical element 1 in which light other than the visible light is a control target.

In addition, the imaging apparatus 10 according to the embodiment includes the imaging element 7 and the optical element 1 in the above described embodiment. In this manner, it is possible to suppress unevenness in optical characteristics due to a difference in input angle of a ray of the optical element 1, due to corresponding to a case in which a principal ray input angle θm at the outermost peripheral portion of the optical element 1 is set to approximately 45 degrees or less.

Accordingly, it is possible to suppress deterioration in optical performance due to a difference in input angle of a ray with respect to the optical element 1, and to realize an imaging apparatus in which it is possible to prevent separate deterioration in image quality associated with image processing for correcting deterioration in image quality which is caused by deterioration in optical performance, and to miniaturize the imaging optical system.

In addition, it is also possible to configure the optical element 1 according to the embodiment so that light with a large principal ray input angle θm is gradually input from a center to the peripheral portion, the thickness gradually increases from the center to the peripheral portion, and when the principal ray input angle θm is set to x, and the increase rate of thickness at a position to which light with the principal ray input angle x is input with respect to the thickness with respect to the center is set to y, the thickness increase rate y with respect to the principal ray input angle x is a thickness increase rate y which is expressed as $y=0.0018x^2+0.0092x$ or more, and is in a range of a thickness increase rate y which is expressed as $y=0.0059x^2+0.0298x$ or less.

In addition, the imaging apparatus 10 according to the embodiment can be configured by including the imaging element 7, and the optical element 1 which satisfies range conditions of the above described thickness increase rates y.

It is possible to suppress the unevenness in optical characteristics due to a difference in input angle of a ray to a degree in which deterioration in image quality falls in an allowable range using the optical element 1.

In this manner, by suppressing the unevenness in optical characteristics due to a difference in input angle of a ray, it is possible to suppress unevenness in optical performance due to a difference in input angle of a ray with respect to the optical element 1.

In addition, in this manner, it is possible to prevent separate deterioration in image quality associated with image processing for correcting deterioration in image quality which is caused by deterioration in optical performance due to a difference in input angle of a ray, and to miniaturize the imaging optical system.

5. Modification Example

Hitherto, the embodiment according to the present technology has been described; however, the present technology is not limited to the above described specific example.

For example, in the above descriptions, a case in which the present technology is applied to the UV/IR cutoff filter has been exemplified; however, the present technology can be widely applied to general optical elements such as other optical filters except for the UV/IR cutoff filter.

In addition, in the above descriptions, the optical element including a dielectric multilayer film has been exemplified; however, as a matter of course, the present technology can also be preferably applied to a case which is configured so as to realize necessary optical characteristics without including the dielectric multilayer film.

In addition, it is also possible to configure the imaging apparatus according to the embodiment of the present technology so as not to include a lens system such as the first lens 4 or the second lens 5 by including a lens tube which is detachable.

In addition, the effect which is described in the specification is merely an example, is not limited, and may be other effects.

6. Present Technology

In addition, the present technology can also adopt the following configuration.

(1) An optical element in which light with a large principal ray input angle is gradually input from a center to a peripheral portion, a thickness gradually increases from the center to the peripheral portion, and $1<RD\leq1.085$ is satisfied, when an increase ratio of a thickness to the center at an outermost peripheral portion to which light of which the principal ray input angle is maximum is input is set to RD.

(2) The optical element which is described in (1), in which $1<RD\leq1.045$ is satisfied.

(3) The optical element which is described in (1) or (2) includes a dielectric multilayer, in which a thickness of the dielectric multilayer film becomes gradually large from a center to a peripheral portion.

(4) The optical element which is described in (3), in which the dielectric multilayer film is formed by alternately laminating a high refractive index material and a low refractive index material.

(5) The optical element which is described in (4), in which the dielectric multilayer film is formed by alternately laminating a $TiO_2$ layer and a $SiO_2$ layer.

(6) The optical element which is described in any one of (3) to (5), in which the number of total layers of the dielectric multilayer film is set to 70 or less.

(7) The optical element which is described in (6), in which the number of total layers is set to 40 to 60.

(8) The optical element which is described in any one of (1) to (7), in which a transmittance with respect to a wavelength range of 450 nm to 650 nm at a center portion is set to be larger than 90%.

(9) An imaging apparatus including an imaging element, and an optical element in which light with a large principal ray input angle is gradually input from a center to a peripheral portion, in which a thickness of the optical element gradually increases from the center to the peripheral portion, and in the optical element, $1<RD\leq1.085$ is satisfied, when an increase ratio of a thickness to the center at an outermost peripheral portion to which light of which the principal ray input angle is maximum is input is set to RD.

(10) An optical element in which light with a large principal ray input angle is gradually input from a center to a peripheral portion, a thickness gradually increases from the center to the peripheral portion, and a thickness increase rate y with respect to a principal ray input angle x is in a range of a thickness increase rate y which is expressed using $y=0.0018x^2+0.0092x$ or more, and a thickness increase rate y which is expressed using $y=0.0059x^2+0.0298x$ or less, when the principal ray input angle is set to x, and an increase rate of a thickness at a position to which light with the principal ray input angle x is input with respect to the center is set to y.

(11) An imaging apparatus including an imaging element, and an optical element in which light with a large principal ray input angle is gradually input from a center to a peripheral portion, in which a thickness of the optical element gradually increases from the center to the peripheral portion, and a thickness increase rate y with respect to a principal ray input angle x is in a range of a thickness increase rate y which is expressed using $y=0.0018x^2+0.0092x$ or more, and a thickness increase rate y which is expressed using $y=0.0059x^2+0.0298x$ or less, when the principal ray input angle is set to x, and an increase rate of a thickness at a position to which light with the principal ray input angle x is input with respect to the center is set to y.

It should be understood by those skilled in the art that various modifications, combinations, sub-combinations and alterations may occur depending on design requirements and other factors insofar as they are within the scope of the appended claims or the equivalents thereof.

What is claimed is:

1. An optical element, comprising:
   wherein light with a large principal ray input angle is gradually input from a center to a peripheral portion,
   wherein a thickness gradually increases from the center to the peripheral portion, and
   wherein $1<RD\leq1.085$ is satisfied, when an increase ratio of a thickness to the center at an outermost peripheral portion to which light of which the principal ray input angle is maximum is input is set to RD.

2. The optical element according to claim 1, wherein $1<RD\leq1.045$ is satisfied.

3. The optical element according to claim 1, further comprising:
   a dielectric multilayer film,
   wherein a thickness of the dielectric multilayer film becomes gradually large from a center to a peripheral portion.

4. The optical element according to claim 3, wherein the dielectric multilayer film is formed by alternately laminating a high refractive index material and a low refractive index material.

5. The optical element according to claim 4, wherein the dielectric multilayer film is formed by alternately laminating a $TiO_2$ layer and a $SiO_2$ layer.

6. The optical element according to claim 3, wherein a number of total layers of the dielectric multilayer film is set to 70 or less.

7. The optical element according to claim 6, wherein the number of total layers is set to 40 to 60.

8. The optical element according to claim 1, wherein a transmittance with respect to a wavelength range of 450 nm to 650 nm at a center portion is set to be larger than 90%.

9. An imaging apparatus, comprising:
   an imaging element; and
   an optical element in which light with a large principal ray input angle is gradually input from a center to a peripheral portion, wherein a thickness of the optical element gradually increases from the center to the peripheral portion, and wherein, in the optical element, $1<RD\leq1.085$ is satisfied, when an increase ratio of a thickness to the center at an outermost peripheral portion to which light of which the principal ray input angle is maximum is input is set to RD.

* * * * *